United States Patent [19]

Hall et al.

[11] 4,253,919

[45] Mar. 3, 1981

[54] ELECTRODEPOSITION OF CADMIUM-SELENIUM SEMICONDUCTING PHOTOELECTRODES FROM AN ACID CITRATE BATH

[75] Inventors: Dale E. Hall, Monroe; William D. K. Clark, Warwick, both of N.Y.

[73] Assignee: The International Nickel Company, Inc., New York, N.Y.

[21] Appl. No.: 114,045

[22] Filed: Jan. 21, 1980

[51] Int. Cl.$^3$ .......................... C25D 9/08; C25D 3/02
[52] U.S. Cl. ................................ 204/37 R; 204/56 R; 204/86
[58] Field of Search ................... 204/86, 92, 115, 128, 204/37 R, 56 R; 136/89 CD; 429/111

[56] References Cited

U.S. PATENT DOCUMENTS

| | | | |
|---|---|---|---|
| 3,419,484 | 12/1968 | Ammerman | 204/86 |
| 3,573,177 | 3/1971 | McNeill | 204/32 |
| 4,127,449 | 11/1978 | Heller et al. | 204/2.1 |
| 4,192,721 | 3/1980 | Fawcett et al. | 204/14 N |

FOREIGN PATENT DOCUMENTS 1532616  11/1978  United Kingdom ...................... 204/86

OTHER PUBLICATIONS

M. P. R. Panicker et al, "Cathodic Deposition of CDTE from Aqueous Electrolytes," *J. Electrochem. Soc.*, vol. 125 (Apr. 1978), pp. 566-572.

F. A. Kröger, "Cathodic Deposition and Characterization of Metallic or Semiconducting Binary Alloys or Compounds," *J. Electrochem. Soc., vol. 125 (Dec. 1978), pp. 2028-2034.*

"Photoelectrochemical Energy Conversion and Storage . . . ," *Nature,* vol. 261, Jun. 3, 1976, pp. 403-404.

"Electrochemical Deposition of a Selenium Alloy," Chemical Abstracts, vol. 75 (1971), #147165q.

"Simultaneous Electrodeposition of Selenium and Cadmium," Chemical Abstracts, vol. 72 (1970), #85584c.

"Electrodeposition of Selenium and Tellurium from Acetic Acid Electrolytes," Chemical Abstracts, vol. 72 (1970), #27642j.

*Primary Examiner*—T. Tung
*Assistant Examiner*—William Leader
*Attorney, Agent, or Firm*—R. J. Kenny; E. A. Steen

[57] ABSTRACT

A process for electrodepositing cadmium and selenium onto a material suitable for use as a photoelectrode in a photovoltaic cell. The plating electrolyte, in one embodiment, consists essentially of an acid citrate bath including hydrated citric acid, hydrated sodium citrate, hydrated cadmium chloride and selenious acid. The deposit may be subsequently heat treated.

22 Claims, No Drawings

ELECTRODEPOSITION OF CADMIUM-SELENIUM SEMICONDUCTING PHOTOELECTRODES FROM AN ACID CITRATE BATH

TECHNICAL FIELD

The invention claimed herein relates to photovoltaic cells in general and more particularly to a plating method especially suited for codepositing cadmium and selenium onto photoelectrodes for use in such cells.

BACKGROUND ART

Recently, many sectors of society have increasingly viewed the sun as a viable and desirable alternative source of energy. Solar energy is non-polluting, abundant and immune to geopolitical factors. Moreover, it is virtually inexhaustable (contrast the Earth's finite supply of fossil fuels) and free from the potential dangers often associated with nuclear power.

Indeed it has been estimated that solar energy impacts the surface of the United States at a rate of approximately $5.56 \times 10^{19}$ BTU's/year ($5.87 \times 10^{22}$ joules/year). Considering that the U.S. consumed $7.8 \times 10^{16}$ BTU's ($8.23 \times 10^{19}$ joules) in 1978, it goes without saying that by tapping even a modest portion of the sun's energy, we can appreciably reduce out dependence on dwindling fuel reserves.

In order to take advantage of this relatively free largesse, various solar energy systems have been proposed and developed. This particular disclosure pertains to a method for improving the production of electrodes for photovoltaic cells.

Photovoltaic cells produce an electrical current by the excitation of electrons by photons. Briefly, certain semiconductors (CdSe, for example) can be directly stimulated by light to generate an electrical current. Although the physics of this process are now well understood, it suffices to say that when a photon of a specific minimum energy level collides with a valence electron, the photon, by imparting its energy to the electron, "kicks" the electron into a higher energy or conduction band while simultaneously leaving a hole (vacancy) in the lower energy valence band. These charge carriers (both the electron and the hole) can be made to move (and thus generate electric current) by having them generated near or within a field region created at some form of semiconductor interface, e.g., metal—semiconductor, n-semiconductor—p-semiconductor, or semiconductor—electrolyte interface. The type of cell utilizing the junction produced at the last interface is known as a photoelectrochemical cell and is the type used to test the electrodeposit made in this disclosure. However, it should be appreciated that the semiconductor electrodeposits produced by the disclosed procedure need not necessarily be restricted to this type of photocell.

More specifically, our invention relates to the production of thin film semiconductor photoelectrodes. Although presently employed in light meters, security devices, etc., it is quite conceivable that this technology will find a place in the wholesale production of electric power.

Presently, cadmium-selenium semiconductors utilized in thin film semiconductors are electrodeposited onto substrates having relatively high electrical conductivities. Typically, these Cd-Se electrodes are prepared in an acid sulfate bath of very low pH (typically 0-1 pH units). This electrolytic solution may prove to be of limited usefulness in that it is believed that an acid sulfate bath may restrict the amount of Se-Cd deposition to a narrow stoichiometric range. This range limiting characteristic of acid sulfate baths may be undesirable in instances where it is necessary to deposit cadmium and selenium over a broad, nonstoichiometric range.

Clearly, a method to facilitate the codeposition of Cd-Se is desirable.

SUMMARY OF THE INVENTION

An acid citrate bath has been developed for simultaneously electrodepositing cadmium and selenium onto a suitable cathode over a broad compositional range from about thirty five to about seventy five weight percent cadmium. Furthermore, by permitting the pH level of the bath to achieve a high of approximately 3 pH units, selenium deposition is enhanced.

In one embodiment, the bath consists of a mixture of hydrated citric acid, hydrated sodium citrate, hydrated cadmium chloride and selenious acid.

The process utilizing this acid citrate bath is especially suited for, but not limited to, the production of photoelectrodes used in photovoltaic cells by employing an electrode exhibiting sufficiently high electrical conductivity values. The bath facilitates the codeposition of cadmium and selenium to form a light sensitive semiconductor. Subsequent heat treatment of the photoelectrode results in enhanced photocell efficiencies.

PREFERRED MODE FOR CARRYING OUT THE INVENTION

Cadmium-selenium baths containing citric acid and metal citrate salts, such as sodium citrate, as supporting electrolytes, form the basis of the claimed process. The pH of the plating bath should be maintained within an approximate range from about 1 to 3 pH units. The selenium content of the electrolyte may be obtained by initially adding selenious acid ($H_2SeO_3$) or selenium dioxide ($SeO_2$) to the plating bath. Cadmium may be added in the form of any common salt, e.g. cadmium chloride ($CaCl_2$), cadmium sulfate ($CdSO_4$), etc. Inasmuch as the plating ratio of cadmium to selenium must be high, the mole ratio of the cadmium to selenium in the bath should be at least 5:1 and preferably 30:1 or more to ensure satisfactory electrodeposits. Moreover, the Cd-Se electrodeposit prepared from the baths described herein should contain at least 35 weight percent cadmium to be suitable for photoelectrode service. The cathode current density should be equal to or greater than 1 mA/cm$^2$. Furthermore, as a result of the plating action, the minimum acceptable current density must be increased as the Cd/Se ratio of the bath decreases.

The cathode substrate upon which Cd-Se films are to be deposited may be any material with sufficiently high electrical conductivity and it may be either metallic or non-metallic (i.e. a metal oxide thin film). In addition, when the deposits are intended for use in photoelectrochemical cells, it is preferable to choose the electrode material so that an ohmic or nearly ohmic contact is achieved between the electrodeposit and the material.

The invention and the manner of applying it may, perhaps, be better understood by a brief discussion of the principles underlying the invention.

As with any electroplating system, the object to be plated (the cathode) is placed into an electrolyte (the bath) along with an anode. Reduction (the physical plating process) occurs at the cathode whereas oxidation occurs at the anode. An electric current, supplied by an external source, is passed through the electrolyte via the cathode and either the anode or a current collector (should the anodic material be disbursed within the bath).

In this particular process, the anodes may be either inert material such as graphite or platinum, in which case the cadmium and selenium contents of the bath are replenished by chemical addition, or actively corroding cadmium and selenium anodes, so that the bath is replenished continuously during plating. Selenium, which is present in small concentrations in the bath, may be particularly amenable to replenishment in this way. To achieve the proper balance between active anode corrosion (that is, oxidation) and cathodic deposition of cadmium and selenium, combinations of both inert and active anodes may also be employed.

EXAMPLE

A titanium (Ti) cathode was simultaneously plated with cadmium and selenium. Platinized titanium baskets were utilized as anodes. The bath was prepared with the following ingredients:

|  | Moles/liter | Grams/liter | Ratio |
|---|---|---|---|
| $C_3H_4(OH)(COOH)_3 \cdot H_2O$ (hydrated citric acid) | 0.286 | 60 |  |
| $Na_3C_6H_5O_7 \cdot 2H_2O$ (hydrated sodium citrate) | 0.272 | 80 |  |
| $CdCl_2 \cdot 2\frac{1}{2} H_2O$ (hydrated cadmium chloride) | 0.788 | 180 |  |
| $H_2SeO_3$ (Selenious acid) | 0.0186 | 2.4 |  |
| Total Citrate Moiety | 0.558 | 107.10 |  |
| Total $Na^+$ | 0.816 | 18.77 |  |
| Total $Cd^{++}$ | 0.788 | 88.60 |  |
| Total $Cl^-$ | 1.576 | 56.0 |  |
| $[Na^+]/[citrate]$ |  |  | 1.46 |
| $[Cd^{++}]/[Se]$ |  |  | 42.36 |

The mode ratio of Cd to Se in the bath was approximately 42:1. The deposition was performed at 3.2 mA/cm² in a stirred solution for 60 minutes at 35° C. Subsequent to the plating step, the deposit was heat treated by exposing it to a temperature of 550° C. for 15 minutes. The resulting deposit was analyzed and it was found that the sample contained 54 weight percent cadmium.

Although any suitable cathodic material may be employed as the photoelectrode, titanium is especially useful in that cadmium-selenide appears to form a desirable ohmic contact with titanium. Moreover, titanium does not corrode in the presence of the photoelectrochemical cell electrolyte. It is preferable to roughen the surface of the photoelectrode prior to plating to improve the adhesion properties of the electrodeposit.

The aforementioned deposit was used on a photoelectrode in the photovoltaic cell containing 1 M NaOH/1 M NaS/1 M S as the redox electrolyte. When the cell was exposed to light from a xenon lamp equipped with a solar simulator filter, an open circuit voltage ($V_{oc}$) of 0.19 volts and a short circuit currently density ($I_{sc}$) of 1.0 mA/cm² was obtained. The energy conversion efficiency of the electrode was approximately 0.8%.

A brief discussion of the underlying chemistry may be illuminating. In aqueous acid media, selenium added to the plating bath as selenious acid (as in the above example) is subject to the following equilibria:

$$H_2SeO_3 \rightarrow H^+ + HSeO_3^- \quad pH=2.57 \qquad (1)$$

and $$HSeO_3 \rightarrow H^+ + SeO_3^- \quad pH=6.58 \qquad (2)$$

In this particular acid citrate bath, which was maintained at approximately 3 pH units, 27% of the selenium in solution was present as $H_2SeO_3$ whereas 73% was in the form of $HSeO_3^-$. (The amount of the doubly ionized form is, for all intents and purposes, negligible).

The reactions and standard potentials for the deposition of selenium from the acid citrate bath are as follows:

$$H_2SeO_3 + 4e^- + 4H^+ \rightarrow Se + 3H_2O \qquad (3)$$

$$E_1° = 0.536 - 0.074 \; pH = 0.314 \; V/SCE \; @ \; pH=3$$

(SCE = a standard saturated calomel electrode)
and $$HSeO_3^- + 4e^- + 5H^+ \rightarrow Se + 3H_2O \qquad (4)$$

$$E_2° = 0.499 - 0.059 \; pH = 0.322 \; V/SCE \; @ \; pH=3$$

In the aforementioned acid citrate bath containing 2.4 grams/liter of selenious acid, the equilibrium potentials of each species, taking into account their relative concentrations and the potential expressions above, are thus:

$$E_{eq1} = 0.288 \; V/SCE \; for \; H_2SeO_3/Se \qquad (5)$$

and $$E_{eq2} = 0.286 \; V/SCE \; for \; H_2SeO_3 \qquad (6)$$

The cathodic deposition of cadmium for aqueous acid electrolytes is described by:

$$Cd^{+2} + 2e^- \rightarrow Cd \qquad (7)$$

$$E° = -0.645 \; V/SCE$$

and in the acid citrate bath containing 180 grams/liter of $CdCl_2 \cdot 2\frac{1}{2} H_2O$ by:

$$E_{eq}, Cd = -0.648 \; V/SCE \; for \; Cd^{+2}/Cd \qquad (8)$$

The large potential difference between the selenium and cadmium species ($\Delta E_{eq} = 0.934$ V from expressions 6 and 8) makes the codeposition of cadmium and selenium as elemental species difficult. There is a much greater tendency for selenium to deposit than cadmium. It has been hypothesized that Cd-Se deposition proceeds first by putting down an Se atom. Cd then discharges at this nucleation site to form Cd-Se. Normally, for codeposition of elements with such large differences in their standard potentials, complexing agents are often used to retard deposition of the more easily-deposited species. However, we found that citrate baths facilitate the codeposition of selenium and cadmium. Moreover, the citrate bath is well buffered against pH changes in the cathode diffusion layer which may arise from selenium deposition (equations 3 and 4). Finally, by operating at a relatively high pH level, less separation tends to occur between the standard potentials of cadmium and selenium.

While in accordance with the provisions of the statutes, there is illustrated and described herein specific embodiments of the invention, those skilled in the art will understand that changes may be made in the form of the invention covered by the claims and that certain features of the invention may sometimes be used to advantage without a corresponding use of the other features.

The embodiments of the invention in which an exclusive property or privilege is claimed are defined as follows:

1. A process for codepositing cadmium-selenium onto a cathodic substrate, the process which comprises placing the cathodic substrate into an acid citrate bath, introducing cadmium and selenium ions into the bath, and passing an electric current through the bath so as to plate the cadmium and selenium onto the cathodic substrate.

2. The process according to claim 1 wherein the pH of the bath is maintained between approximately 1 to 3 pH units.

3. The process according to claim 1 wherein the bath comprises citric acid and metal citrate salts.

4. The process according to claim 1 wherein cadmium and selenium act as actively corroding anodes in the bath.

5. The process according to claim 1 wherein an inert material acts as a current collector in the bath.

6. The process according to claim 1 wherein cadmium is introduced into the bath in the form of a cadmium salt.

7. The process according to claim 1 wherein selenium is introduced into the bath in the form of selenious acid.

8. The process according to claim 1 wherein selenium is introduced into the bath in the form of selenium dioxide.

9. The process according to claim 1 wherein the mole ratio of cadmium to selenium is greater than 5:1.

10. The process according to claim 1 wherein the cathode current density is equal to or greater than 1 $mA/cm^2$.

11. The process according to claim 1 wherein the deposit contains at least 35 weight percent cadmium.

12. The process according to claim 1 wherein the cathodic substrate has sufficiently high electrical conductivity characteristics for use as a photoelectrode.

13. The process according to claim 12 wherein the deposit is heat treated to enhance its photocurrent generating capabilities.

14. A process for electrodepositing cadmium and selenium onto a cathode, the process which comprises:
 (a.) preparing an acid citrate plating bath consisting essentially of the following ingredients in approximately the following mole ratios:
   (1) 0.286 moles/liter of citric acid.$H_2O$,
   (2) 0.272 moles/liter of sodium citrate.2$H_2O$,
   (3) 0.788 moles/liter of cadmium chloride.2½$H_2O$,
   (4) 0.0186 moles/liter of selenious acid; and
 (b.) passing an electric current through the bath via the cathode and a current collector so as to deposit the cadmium and selenium onto the cathode.

15. The process according to claim 14 wherein the pH of the bath is maintained approximately between 1 and 3 pH units.

16. The process according to claim 14 wherein the cathode current density is approximately 3.2 $mA/cm^2$.

17. The process according to claim 14 where the deposition is performed for approximately 60 minutes.

18. The process according to claim 14 wherein the temperature of the bath is maintained at approximately 35° C.

19. The process according to claim 14 wherein the cathode deposit is suitable for use as a photoelectrode.

20. The process according to claim 19 wherein the cathode substrate is titanium.

21. The process according to claim 14 wherein the deposit is heat treated to enhance its photocurrent generating capabilities.

22. The process according to claim 21 wherein the deposit is heat treated at a temperature of approximately 550° C. for about 15 minutes.

* * * * *